(12) United States Patent
Osako

(10) Patent No.: US 9,049,784 B2
(45) Date of Patent: Jun. 2, 2015

(54) FLEXIBLE DISPLAY INCLUDING A FLEXIBLE DISPLAY PANEL HAVING AN OPENING

(71) Applicant: PANASONIC CORPORATION, Osaka (JP)

(72) Inventor: Takashi Osako, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/357,658

(22) PCT Filed: Nov. 19, 2012

(86) PCT No.: PCT/JP2012/007401
§ 371 (c)(1),
(2) Date: May 12, 2014

(87) PCT Pub. No.: WO2013/076950
PCT Pub. Date: May 30, 2013

(65) Prior Publication Data
US 2014/0307397 A1    Oct. 16, 2014

(30) Foreign Application Priority Data
Nov. 24, 2011    (JP) .................................. 2011-256831

(51) Int. Cl.
*H01L 51/52* (2006.01)
*H01L 33/50* (2010.01)
*H05K 1/02* (2006.01)
*H05B 33/02* (2006.01)
*H05B 33/06* (2006.01)
(Continued)

(52) U.S. Cl.
CPC .............. *H05K 1/0281* (2013.01); *H05B 33/02* (2013.01); *H05B 33/06* (2013.01); *H01L 27/3244* (2013.01); *G09G 3/3225* (2013.01); *G09G 2380/02* (2013.01)

(58) Field of Classification Search
CPC ................... H01L 2251/5338; H01L 51/5237; H01L 27/3244; H05B 33/26; H05B 33/04
USPC .................................................... 313/511, 512
See application file for complete search history.

(56) References Cited

U.S. PATENT DOCUMENTS 7,543,376 B2   6/2009   Yoshino et al.
8,314,787 B2   11/2012  Ito
8,780,568 B2   7/2014   Osako et al.
(Continued)

FOREIGN PATENT DOCUMENTS

JP    04-022075    1/1992
JP    09-090392    4/1997
(Continued)

OTHER PUBLICATIONS

International Search Report (ISR) in International Application No. PCT/JP2012/007401, dated Feb. 12, 2013.

*Primary Examiner* — Joseph L Williams
(74) *Attorney, Agent, or Firm* — Greenblum & Bernstein, P.L.C.

(57) ABSTRACT

A flexible display includes: a display panel which is flexible; and a flexible circuit board which is disposed on a side of the display panel and includes an integrated circuit element provided on a surface thereof and an opening portion. The opening portion is in a shape extending in a second direction vertical to a first direction which is parallel to the side of the display panel to which the flexible circuit board is connected, and the integrated circuit element and the opening portion are arranged in the first direction.

6 Claims, 15 Drawing Sheets

(51) Int. Cl.
*G09G 3/32* (2006.01)
*H01L 27/32* (2006.01)

(56) References Cited

U.S. PATENT DOCUMENTS

| | | | |
|---|---|---|---|
| 2003/0058230 | A1 | 3/2003 | Ide |
| 2009/0167731 | A1 | 7/2009 | Ito |
| 2013/0058057 | A1 | 3/2013 | Takemori et al. |
| 2014/0055328 | A1 | 2/2014 | Osako |

FOREIGN PATENT DOCUMENTS

| | | |
|---|---|---|
| JP | 11-153964 | 6/1999 |
| JP | 2003-108017 | 4/2003 |
| JP | 2003-324255 | 11/2003 |
| JP | 2003-337550 | 11/2003 |
| JP | 2006-309184 | 11/2006 |
| JP | 2007-199464 | 8/2007 |
| JP | 2008-152107 | 7/2008 |
| JP | 2008-298828 | 12/2008 |
| JP | 2009-157070 | 7/2009 |
| JP | 2011-027814 | 2/2011 |

FIG. 9
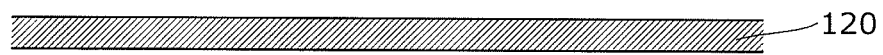
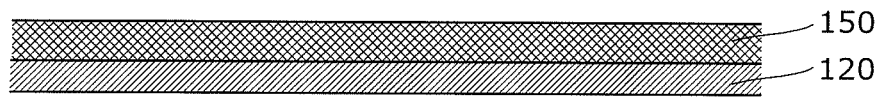
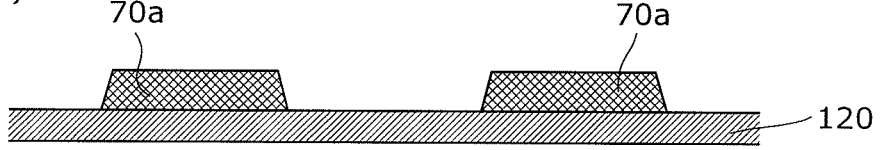
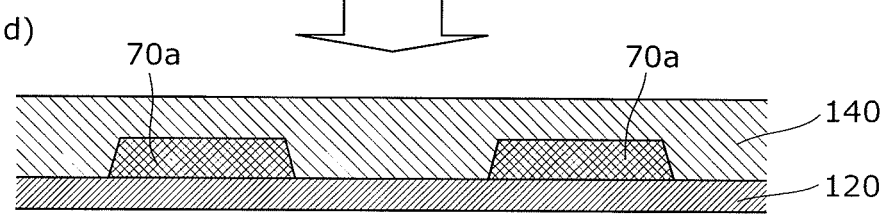
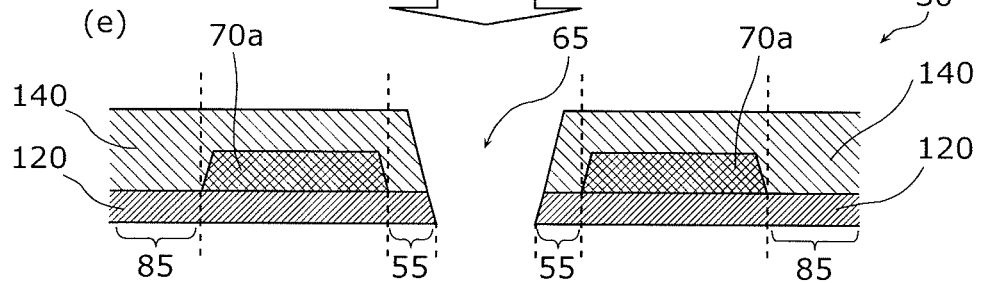

FLEXIBLE DISPLAY INCLUDING A FLEXIBLE DISPLAY PANEL HAVING AN OPENING

TECHNICAL FIELD

The present invention relates to a flexible display which includes a bendable display panel.

BACKGROUND ART

In recent years, flexible displays with bendable display panels have been actively developed using an organic electro luminescence (EL) element and so on. These flexible displays and displays with conventional liquid crystal panels and so on have a structure in which the display panel and the driving unit are electrically connected by a flexible circuit board provided with an integrated circuit element for driving the pixel circuit of the display panel.

Patent Literature (PTL) 1 discloses a technique for providing, in a flexible circuit board provided with an integrated circuit element as described above, openings in the flexible circuit board in order to prevent cracks of the solder which connects and fixes the terminal portion of the integrated circuit element and the flexible circuit board. Here, cracks are caused by expansion or contraction of the flexible circuit board due to heat generation by the integrated circuit element.

The technique disclosed in PTL 1 aims to divide the stress and prevent the solder cracks at the terminal portion of the integrated circuit element, by providing thinner portions or openings at positions corresponding to the corners of the integrated circuit element on the flexible circuit.

CITATION LIST

Patent Literature

[PTL 1] Japanese Unexamined Patent Application Publication No. 2006-309184

SUMMARY OF INVENTION

Technical Problem

Unlike the flexible circuit board used for the display in which the display panel is not bent, the flexible circuit board used for the flexible display is bent frequently, which causes a higher risk of the integrated circuit element flaking off from the flexible circuit board and breaking caused by the bending.

Therefore, the present invention has an object to provide a highly-reliable flexible display which includes a flexible circuit board which reduces the risk of the integrated circuit element flaking off from the flexible circuit board and breaking.

Solution to Problem

In order to solve the above problem, a flexible display according to an aspect of the present invention includes: a display panel which is flexible; and a flexible circuit board which is disposed on a side of the display panel and includes an integrated circuit element provided on a surface thereof and an opening portion, wherein the opening portion is in a shape extending in a second direction vertical to a first direction which is parallel to the side of the display panel, and the integrated circuit element and the opening portion are arranged in the first direction.

Advantageous Effects of Invention

With the flexible display according to the present invention, it becomes possible to realize a highly-reliable flexible display which includes a flexible circuit board which reduces the risk of the integrated circuit element flaking off from the flexible circuit board and breaking.

BRIEF DESCRIPTION OF DRAWINGS

FIG. 9 (*a*)-(*e*) is a sectional view illustrating how to form the flexible circuit board and an opening portion.

DESCRIPTION OF EMBODIMENTS

Underlying Knowledge Forming Basis of the Invention

A flexible display has a feature that the display panel is bendable. Here, being bendable includes not only being bent freely but also being bent and fixed. When the display panel is bent, the flexible circuit board connected to the display panel is also bent at the same time. Thus, the flexible circuit board used for the flexible display is bent in more than one direction, which is different from the flexible circuit board used for the display in which the display unit is not bent. Furthermore, it is bent more frequently than the flexible circuit board used for the display in which the display unit is not bent.

Figure 1:
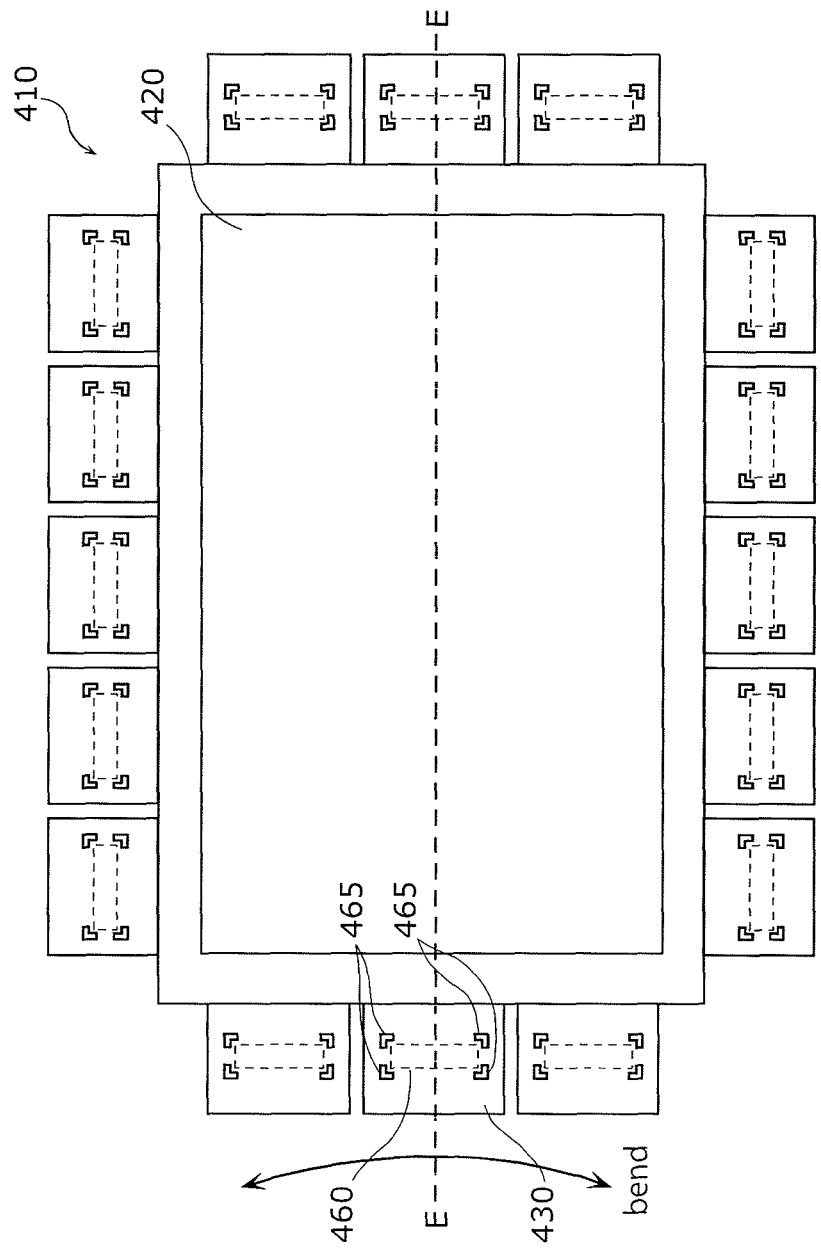
FIG. 1 is a schematic diagram illustrating a structure of a flexible display adopted with the technique disclosed in PTL 1.
Figure 2:
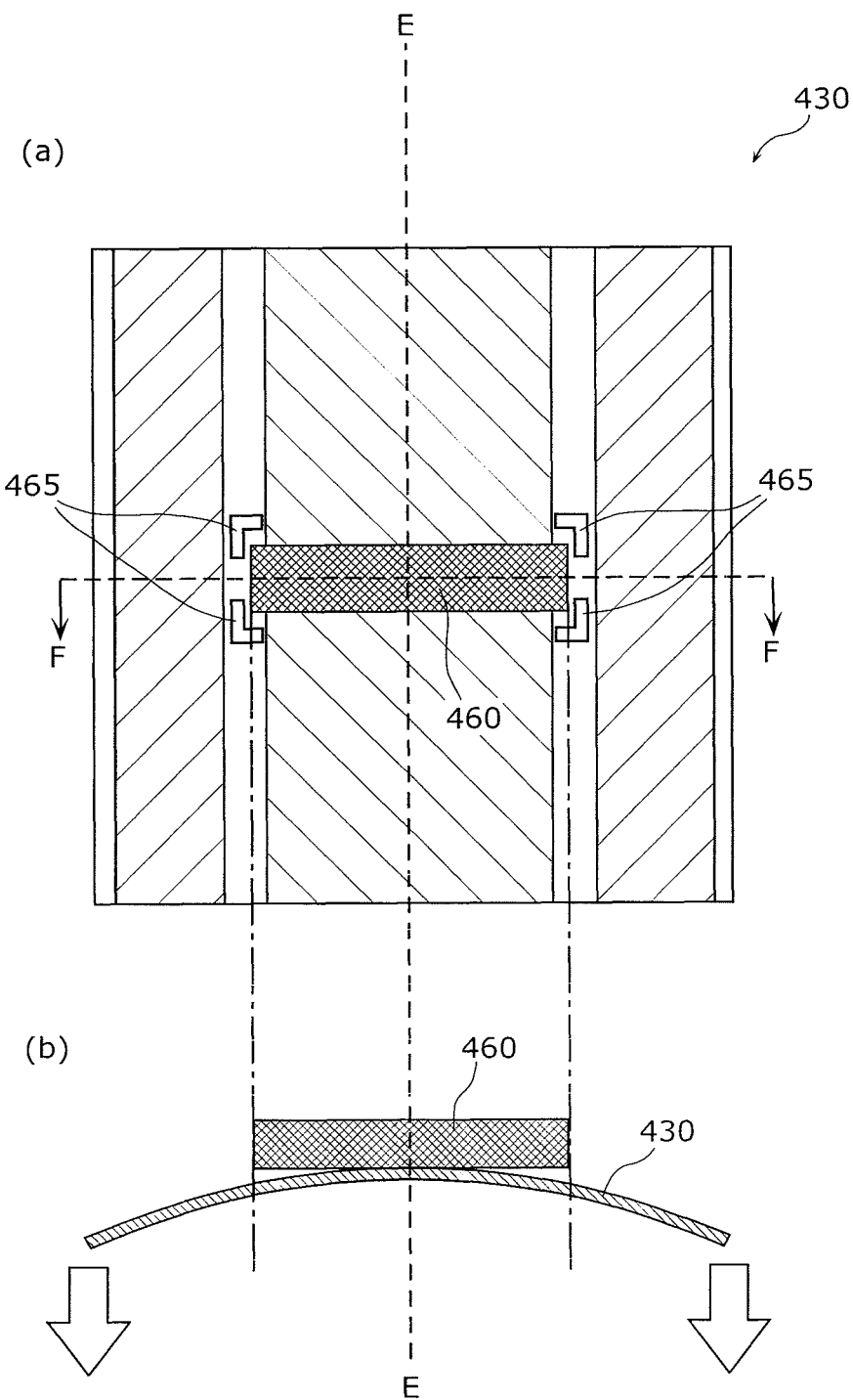
FIGS. 2 (*a*) and (*b*) illustrates stress placed on a flexible circuit board when a display panel of the flexible display adopted with the technique disclosed in PTL 1 is bent.

FIG. 1 and FIG. 2 are schematic diagrams illustrating the case where the technique disclosed in PTL 1 is adopted for a flexible display 410. Hereinafter, description is provided on the direction in which the display panel is bent and the stress placed on the integrated circuit element on the flexible circuit board, with reference to FIG. 1 and FIG. 2.

A display panel 420 includes a plurality of flexible circuit boards 430 on the two short sides and two long sides of the display panel 420.

Each of the flexible circuit boards 430 includes a rectangle integrated circuit element 460. The integrated circuit element 460 is provided on the flexible circuit board 430 in a manner that the long side of the integrated circuit element 460 is parallel to the side of the display panel 420 to which the flexible circuit board 430 is connected.

The flexible circuit board 430 has openings 465 disclosed in PTL 1 at positions corresponding to the corners of the integrated circuit element 460 in the flexible circuit board 430.

When the display panel 420 is bent along the straight line indicated by E-E in FIG. 1, force is placed on the integrated circuit element 460 provided on the flexible circuit board 430, in a direction perpendicular to the main surface of the integrated circuit element 460 (the main surface of the flexible circuit board 430).

FIG. 2 illustrates the stress placed on the flexible circuit board 430 and the integrated circuit element 460. In FIG. 2, (a) is a top view of the flexible circuit board 430, and (b) is a sectional view (sectional view along F-F line in (a) in FIG. 2) of the flexible circuit board 430.

When the display panel 420 of the flexible display 410, adopted with the technique disclosed in PTL 1, is bent along the straight line indicated by the E-E line in FIG. 2, the force indicated by the arrow in (b) in FIG. 2 is placed on the flexible circuit board 430, and the flexible circuit board 430 itself tries to bend.

With the structure of the flexible circuit board 430 adopted with the technique disclosed in PTL 1, the bending stress has nowhere to escape, and thus the region in which the integrated circuit element 460 is provided in the flexible circuit board 430 tries to bend.

Thus, unusual stress is placed on the integrated circuit element 460, which increases the risk of the integrated circuit element 460 flaking off from the flexible circuit board 430 and breaking. The openings 465 are provided without taking into consideration such bending of the flexible circuit board 430, and thus are not effective in preventing flaking or breaking of the integrated circuit element 460.

In view of the above, a flexible display according to an aspect of the present invention includes: a display panel which is flexible; and a flexible circuit board which is disposed on a side of the display panel and includes an integrated circuit element provided on a surface thereof and an opening portion, wherein the opening portion is in a shape extending in a second direction vertical to a first direction which is parallel to the side of the display panel, and the integrated circuit element and the opening portion are arranged in the first direction.

As described above, providing the opening portion in the flexible circuit board allows reducing the stress placed on the integrated circuit element by the bending of the display panel and reducing the risk of the integrated circuit element flaking off from the flexible circuit board and breaking.

Furthermore, in an aspect of the present invention, the integrated circuit element may be disposed in a region between a straight line which passes through a first end of the opening portion in the second direction and is parallel to the first direction and a straight line which passes through a second end of the opening portion in the second direction and is parallel to the first direction. Furthermore, the flexible circuit board may include a plurality of the opening portions, and the integrated circuit element may be disposed between the opening portions.

This effectively reduces the stress placed on the integrated circuit element even when the display panel is bent and thus the flexible circuit board is bent.

Furthermore, in an aspect of the present invention, the flexible circuit board may further include a power source line which supplies a driving current to the display panel, and the opening portion may be disposed in the power source line. Furthermore, a lengthwise direction of the opening portion may be parallel to a direction of a current in the power source line.

The power source line of the flexible circuit board is strong. Accordingly, providing the opening portion in the power source line allows reducing the risk of the flexible circuit board breaking from the opening portion even when the flexible circuit board is bent repeatedly. Furthermore, providing the opening portion to extend in the direction parallel to the direction of the current suppresses the increase in the line resistance.

Furthermore, in an aspect of the present invention, the opening portion may be in a shape of a slit.

This minimizes the increase in the line resistance.

Furthermore, in an aspect of the present invention, the opening portion may have an inner peripheral surface covered with resin.

This prevents the flexible circuit board from being disconnected from the opening portion even when the display panel is bent repeatedly.

The following describes the embodiment of the present invention in detail with reference to the drawings. It is to be noted that the embodiment described below is a comprehensive or specific example of the present invention. Numeric values, shapes, constituents, positions and topologies of the constituents, and the like in the embodiment are an example of the present invention, and it should therefore not be construed that the present invention is limited to the embodiment. Out of the constituents in the following embodiments, the constituents not stated in the independent claims describing the broadest concept of the present disclosure are described as optional constituents.

Embodiment

Figure 3:
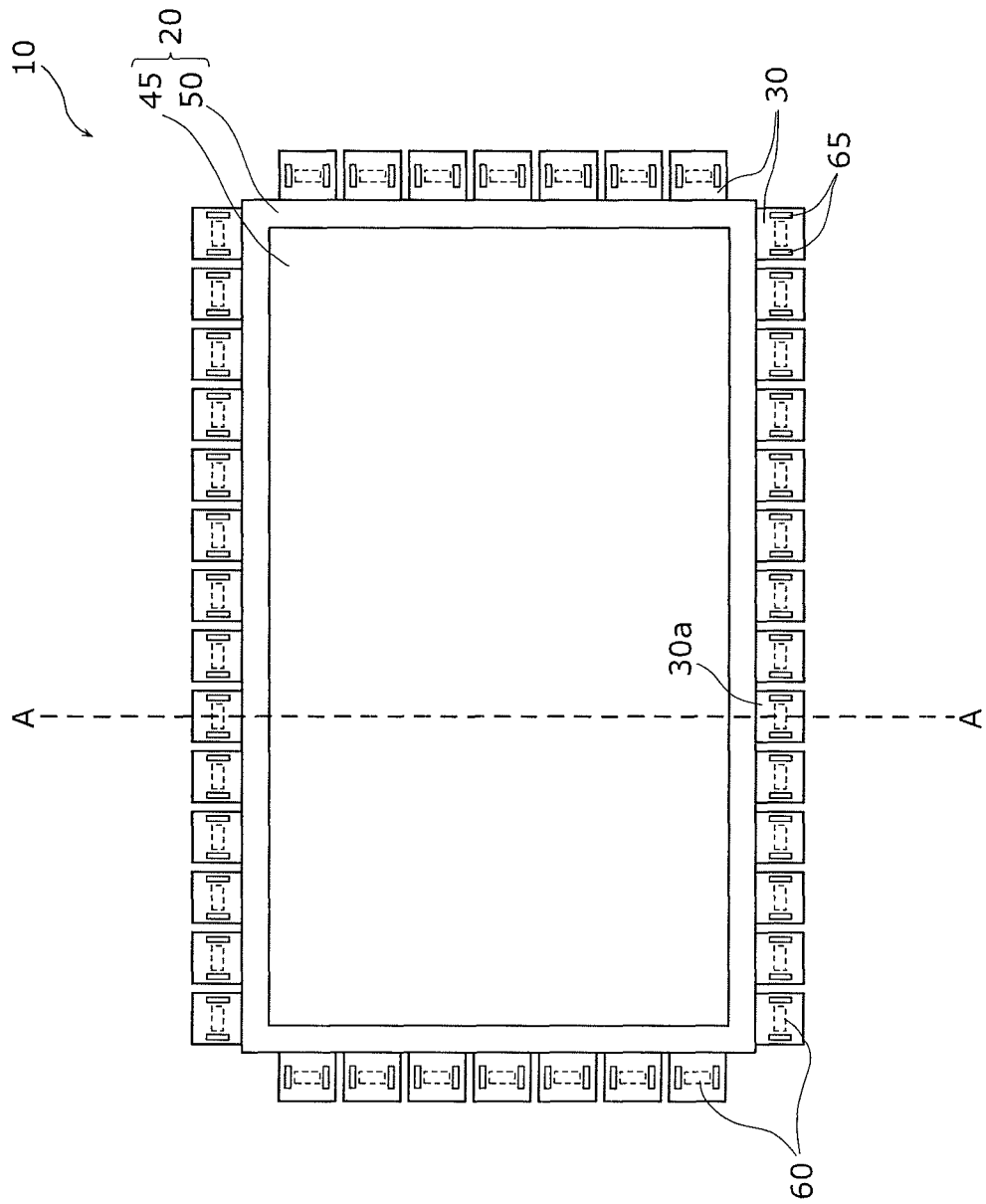
FIG. 3 is a plan view illustrating a structure of a flexible display according to an embodiment.

FIG. 3 is a plan view illustrating a structure of a flexible display according to an embodiment.

A flexible display 10 is an active-matrix display in which an organic EL panel is used. Each of organic EL elements includes a pixel circuit including a thin film transistor (TFT) which is a control element for light emission.

The flexible display 10 includes a display panel 20 which is flexible, and a plurality of flexible circuit boards 30 connected to the display panel 20.

The display panel 20 is an organic EL panel and a thin bendable display. The display panel 20 includes a pixel region 45 in which a plurality of light-emitting pixels which emit light of red (R), green (G), and blue (B) are arranged in a matrix, for example. The pixel region 45 includes a power source line which supplies a driving current to the light-emitting pixels, a scanning line which is a signal line corresponding to the row direction of the light-emitting pixels, and a data line which is a signal line corresponding to the column direction of the light-emitting pixels.

The power source line and the signal line (data line and scanning line) in the pixel region 45 extend to an outer periphery of the display panel 20 and form a line region 50.

The flexible circuit board 30 is disposed on each side of the display panel 20, and includes an integrated circuit element 60 provided on the surface thereof and an opening portion 65. In FIG. 3, the integrated circuit element 60 is provided on a back surface of the flexible circuit board 30. However, the present invention does not specifically limit the surface of the flexible circuit board 30 on which the integrated circuit element 60 is provided.

Although not shown in the Drawings, the line region 50 of the display panel 20 is electrically connected to the driving board via the flexible circuit board 30.

A single flexible circuit board 30 is provided with a single integrated circuit element 60. The integrated circuit element 60 is rectangle, and (i) a long side of the integrated circuit element 60 and (ii) a side of the display panel 20 to which the flexible circuit board 30 provided with the integrated circuit element 60 is connected are in parallel.

The flexible circuit board 30 connected to a short side of the display panel 20 mainly drives the scanning line of the pixel region 45 and supplies a driving current to the line region 50, out of the display panel 20.

Furthermore, the flexible circuit board 30 connected to a long side of the display panel 20 mainly drives the data line of the pixel region 45 and supplies a driving current to the line region 50, out of the display panel 20.

Each of the flexible circuit boards 30 is provided with an opening portion 65. In the present embodiment, a single flexible circuit board is provided with two opening portions.

Next, the flexible circuit board 30 is detailed.

Figure 4:
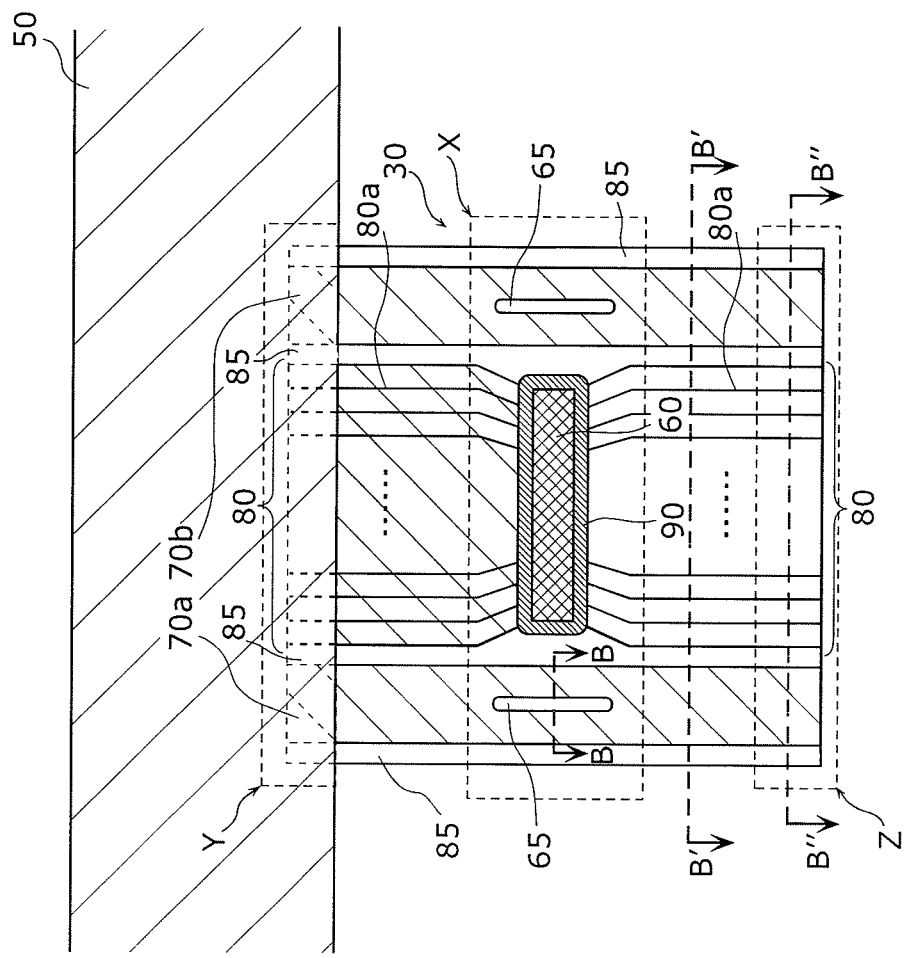
FIG. 4 is an enlarged view of a flexible circuit board.

FIG. 4 is an enlarged view of the flexible circuit board 30. Although the top face of the flexible circuit board 30 has a cover 140 as in FIG. 5 which is described later, the cover 140 is not shown in FIG. 4 to facilitate explanation.

The flexible circuit board 30 includes power source lines 70a and 70b for supplying a driving current (power) to the display panel 20, a signal line portion 80 including a plurality of signal lines 80a for transmitting control signals to the display panel 20, and an integrated circuit element 60. Out of the power source lines 70a and 70b, regions corresponding to sides of two short sides of the integrated circuit element 60 are provided with opening portions 65. Furthermore, between each of the power source lines 70a and 70b and the signal line 80a, a pattern portion 85 which includes no line is provided.

The flexible circuit board 30 constitutes a film package such as a tape career package (TCP) and a chip on film (COF) with the integrated circuit element 60, is disposed between the display panel 20 and the driving board, and relays the driving signal and the driving current corresponding to the data line of the pixel circuit.

The integrated circuit element 60 is rectangle, and is provided in a substantially central region (central region parallel to the side of the display panel 20) of the flexible circuit board 30 so that the side of the display panel 20 to which the flexible circuit board 30 is connected and the long sides of the integrated circuit element 60 are in parallel.

The two long sides of the integrated circuit element 60 are provided with terminal portions including a plurality of terminals. The terminal portions and the signal lines 80a of the signal line portion 80 of the flexible circuit board 30 are electrically connected. Specifically, each terminal of the integrated circuit element 60 is joined with the signal line 80a of the flexible circuit board 30. It is to be noted that the two short sides of the integrated circuit element 60 are not provided with the terminal portions.

In the present embodiment, the integrated circuit element 60 and the flexible circuit board 30 are further fixed with reinforcing resin 90. The reinforcing resin 90 is thermosetting urea resin, but may be light curing resin.

The reinforcing resin 90 is applied along the periphery of the integrated circuit element 60, and prevents the integrated circuit element 60 from flaking off from the flexible circuit board 30. Furthermore, the reinforcing resin 90 is also applied to the terminal portions provided at the long sides of the integrated circuit element 60. With this, the reinforcing resin 90 also protects the terminal portions. It is to be noted that the reinforcing resin 90 is in direct contact with the terminal portions, and thus is an insulator.

The power source lines 70a and 70b are provided at both ends of the flexible circuit board 30 in a direction parallel to the side of the display panel 20 to which the flexible circuit board 30 is connected, and are disposed to sandwich the integrated circuit element 60. Each of the power source lines 70a and 70b is a line for supplying a driving current from a driving board to the line region 50 of the display panel 20, and are wired in a direction vertical to the side of the display panel 20 to which the flexible circuit board 30 is connected. Furthermore, the line width of the power source line 70a and the line width of the power source line 70b may be equal or different.

The signal line portions 80 are provided to sandwich the integrated circuit element 60. Furthermore, the signal line portion 80 includes a plurality of signal lines 80a for transmitting control signals to the line region 50 of the display panel 20. The plurality of signal lines 80a is wired to electrically connect the integrated circuit element 60 and the line region 50, and to electrically connect the integrated circuit element 60 and the driving board.

At an upper end (Y portion in FIG. 4) connected to the side of the display panel 20 and a lower end (Z portion in FIG. 4) connected to the driving board, of the flexible circuit board 30, the terminal portions of the power source lines 70a and 70b and the terminal portions of the signal line portion 80 are formed. An anisotropic conductive adhesive film (ACF) including conducting particles is provided between the terminal portions formed at the upper end and the line region 50 of the display panel 20, and the flexible circuit board 30 and the line region 50 of the display panel 20 are electrically connected by pressure bonding.

Likewise, the anisotropic conductive adhesive film including conducting particles is provided between the terminal portions formed at the lower end of the flexible circuit board 30 and the driving board, and the flexible circuit board 30 and the driving board are electrically connected by pressure bonding. The flexible circuit board 30 is disposed between the display panel 20 and the driving board, and the integrated circuit element 60 outputs driving signals to the signal line (data line and scanning line) of the pixel circuit.

Hereinafter, the power source lines 70a and 70b and the signal line portion 80 are detailed.

Figure 5:
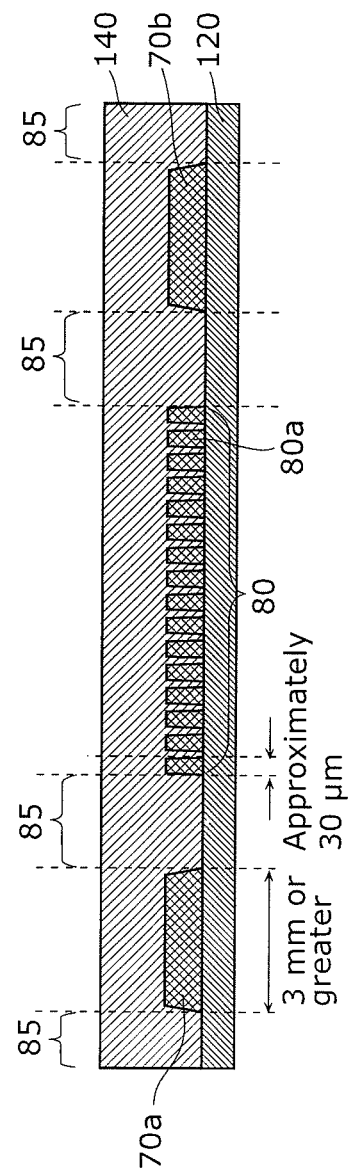
FIG. 5 is a sectional view (sectional view along B'-B' line in FIG. 4) of the flexible circuit board.

FIG. 5 is a sectional view (sectional view along B'-B' line in FIG. 4) of the flexible circuit board 30.

As shown in FIG. 5, the power source lines 70a and 70b of the flexible circuit board 30 are formed on the top face of the base 120, and the top faces of the power source lines 70a and 70b are covered with the cover 140.

Likewise, the signal line 80a of the flexible circuit board 30 is formed on the top face of the base 120, and the top face of the signal line 80a is covered with the cover 140.

At the pattern portion 85 including no line, the cover 140 is formed on the top face of the base 120.

The base 120 comprises polyimide or kapton for example, and the power source lines 70a and 70b and the signal line 80a are copper lines for example. Furthermore, the cover 140 comprises solder resist for example.

The signal line 80a has a line width of approximately 30 μm for example, and the power source lines 70a and 70b each have a line width of 3 mm or greater for example.

This is because the line widths of the lines are determined by taking into account voltage drop and so on. The selfluminous display panel 20 such as an organic EL panel requires a large driving current. Thus, a current larger than a current in the signal line 80a flows in the power source lines 70a and 70b which supply a current to the display panel 20. Accordingly, the power source lines 70a and 70b are wider than the signal line 80a.

Furthermore, the power source lines 70a and 70b are lines for supplying driving current to the line region 50 of the display panel 20, and not to the integrated circuit element 60. The line which supplies power to the integrated circuit element 60 is different from the power source lines 70a and 70b, and is included in the signal line portion 80. Accordingly, the power source lines 70a and 70b are not electrically connected to the integrated circuit element 60.

At the terminal portions in the upper end and the lower end of the flexible circuit board 30 in FIG. 4, the cover 140 is not formed.

Figure 6:
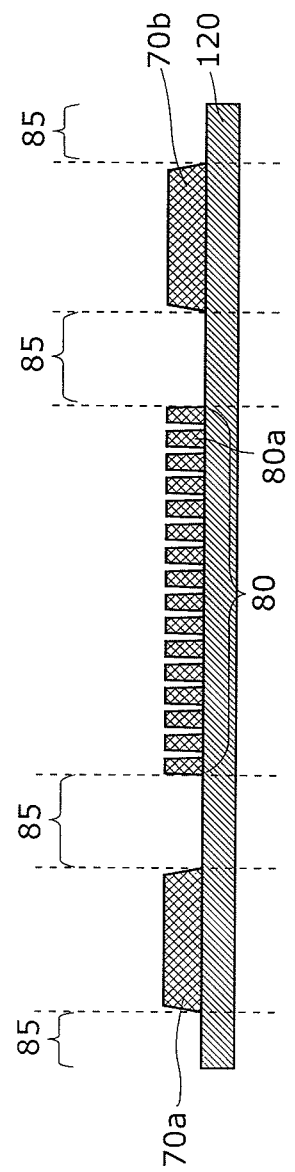
FIG. 6 is a sectional view (sectional view along B"-B" line in FIG. 4) of the flexible circuit board.

FIG. 6 is a sectional view (sectional view along B"-B" line in FIG. 4) of the flexible circuit board 30.

As shown in FIG. 6, the cover 140 is not formed at the lower end of the flexible circuit board 30. This is because the terminal portion at the lower end is electrically connected to the driving board by the anisotropic conductive adhesive film, as described above.

Likewise, the cover 140 is not formed at the upper end of the flexible circuit board 30. This is because the terminal portion at the upper end is electrically connected to the line region 50 by the anisotropic conductive adhesive film.

Next, the opening portion 65 is detailed.

Figure 7:
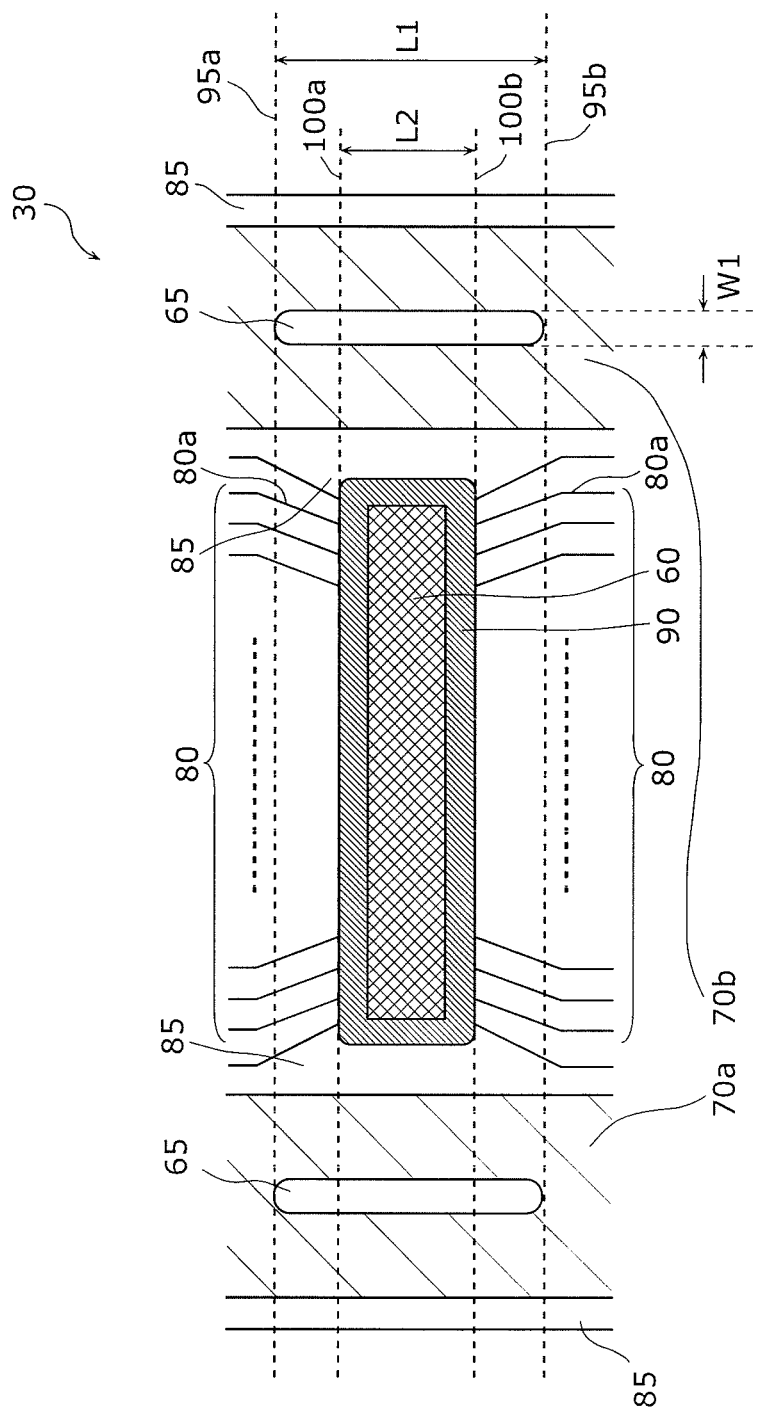
FIG. 7 is an enlarged view (enlarged view of X portion in FIG. 4) of the flexible circuit board.

FIG. 7 is an enlarged view (enlarged view of X portion in FIG. 4) of the flexible circuit board 30.

The opening portions 65 are provided in the power source lines 70a and 70b. As described above, the power source lines 70a and 70b have line widths greater than the line width of the signal line 80a. This makes it easier to provide the opening portions 65 in the power source lines 70a and 70b.

Furthermore, when the opening portions 65 are provided in the flexible circuit board 30, relatively great stress is placed around the opening portions 65 out of the flexible circuit board 30. Accordingly, when the opening portions 65 are provided around a thin line like the signal line 80a, the signal line 80a is more likely to be disconnected.

However, as shown in FIG. 7, when the opening portions 65 are provided in the power source lines 70a and 70b, a sufficient distance can be secured between the opening portions 65 and the signal line 80a. Accordingly, providing the opening portions 65 in the power source lines 70a and 70b is effective since it suppresses disconnection of the signal line 80a and improves the reliability of the flexible circuit board 30.

One of the opening portions 65 is provided in the power source line 70a and the other one of the opening portion 65 is provided in the power source line 70b. Each of the opening portions 65 is extending in the second direction vertical to the first direction which is parallel to the side to which the flexible circuit board 30 of the display panel 20 is connected. Furthermore, the integrated circuit element 60 and the opening portion 65 are arranged in the first direction. Furthermore, in the present embodiment, the integrated circuit element 60 is disposed between a plurality of the opening portions 65.

The integrated circuit element 60 is disposed in a region between a straight line 95a which passes through a first end of the opening portion 65 in the second direction which is parallel to the first direction (terminal portion closer to the display panel 20) and is parallel to the first direction and a straight line 95b which passes through a second end of the opening portion 65 in the second direction (terminal portion closer to the driving board) and is parallel to the first direction.

The opening portion 65 is in a race track shape which has the long axis in the second direction, as shown in FIGS. 4 and 7.

Since the opening portion 65 in the race-track shape is longer in the second direction, the length of the opening portion 65 in the second direction (length L1 in FIG. 7) is longer than the length of the opening portion 65 in the first direction (length W1 in FIG. 7).

The opening portion 65 is in a shape having no corner, which prevents the flexible circuit board 30 from being disconnected from the corner portion of the opening portion 65 even when the display panel 20 is bent repeatedly.

The length of the integrated circuit element 60 in the second direction (length L2 in FIG. 7) is shorter than the length of the opening portion 65 in the second direction. The length of the integrated circuit element 60 in the second direction is not only the length of the package portion of the integrated circuit element 60 but also the length including the reinforcing resin 90 which fixes the integrated circuit element 60.

Providing the opening portion 65 having the structure in FIG. 7 allows effectively reducing the stress placed on both the integrated circuit element 60 itself and the joined portion between the terminal portion of the integrated circuit element 60 and the signal line portion 80, even when the flexible circuit board 30 is bent.

In the power source lines 70a and 70b of the flexible circuit board 30, a current flows in a direction vertical to the side of the display panel 20 to which the flexible circuit board 30 is connected. The opening portion 65 has the length L1> the length W1. Specifically, the lengthwise direction of the opening portion 65 is parallel to the direction of the current in the power source lines 70a and 70b. This suppresses the increase in the line resistance, since the lengthwise direction of the opening portion 65 and the direction of the current is the same.

Although it is described that the length L1> the length L2 in the present embodiment, the case where the length L1< the length L2 is also included in the present invention. However, in this case, it is preferable that the opening portion 65 is disposed in a region between a straight line 100a which passes through a first end of the integrated circuit element 60 in the second direction (terminal portion closer to the display panel 20) and is parallel to the first direction and a straight line 100b which passes through a second end of the integrated circuit element 60 in the second direction (terminal portion closer to the driving board) and is parallel to the first direction.

Figure 8:
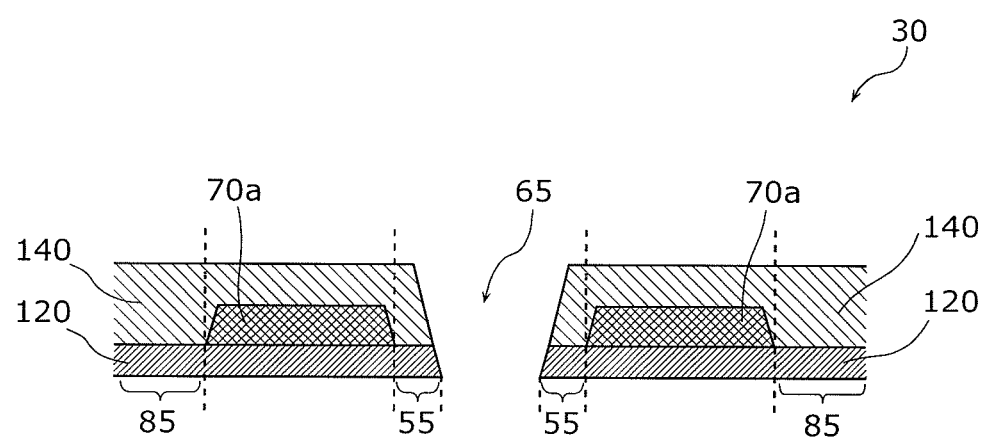
FIG. 8 is a sectional view (sectional view along B-B line in FIG. 4) of the flexible circuit board.

FIG. 8 is a sectional view (sectional view along B-B line in FIG. 4) of the flexible circuit board 30.

As shown in FIG. 8, the opening portion 65 is provided within the power source line 70a. The power source line 70a includes metal material and thus is strong. Accordingly, providing the opening portion 65 in the power source line 70a as described above reduces the risk of breaking of the flexible circuit board 30 from the opening portion 65 in the case where the display panel 20 is bent repeatedly.

FIG. 9 is a sectional view illustrating how to form the flexible circuit board 30 and the opening portion 65.

First, on the base 120 in (a) in FIG. 9, the metal layer 150 is formed by sputtering or casting as shown in (b) in FIG. 9. In the present embodiment, the metal layer 150 is copper. Next, etching is performed on the portion other than the necessary portion of the metal layer 150, as shown in (c) in FIG. 9. In (c) in FIG. 9, the portion to be the power source line 70a is kept and the unnecessary portion of the metal layer 150 is etched. Here, an opening is formed in the region, in which the opening portion 65 is to be formed, of the power source line 70a. Forming the opening in a size larger than the size of the opening portion 65 allows forming the inner peripheral surface of the opening portion 65 with the cover 140 and with resin.

Moreover, the cover 140 is formed as shown in (d) in FIG. 9. Finally, the opening portion 65 is formed as shown in (e) in FIG. 9. Here, the inner peripheral surface of the opening portion 65 is coated with resin.

Although description is provided based on the case where the cover 140 is formed at a position where the opening portion 65 is formed, the cover 140 does not have to be formed at the position where the opening portion 65 is formed. Furthermore, the opening portion 65 may be formed simultaneously with the final punching of the flexible circuit board into the individual shapes.

With this, the power source line 70a is not exposed on the inner peripheral surface of the opening portion 65, which prevents the power source line 70a from corroding.

Furthermore, when the inner peripheral surface of the opening portion 65 is covered with resin, it is effective to provide a coated portion 55 having a predetermined width as in FIG. 8 and (e) in FIG. 9. With this, even when a scratch and so on is caused in the inner peripheral surface of the opening portion 65, the risk of the scratch spreading and reaching the power source line 70a can be reduced. Specifically, providing the coated portion 55 of the predetermined width improves the durability of the flexible circuit board 30.

Although the cover 140 covers the entire surface of the flexible circuit board 30 in FIG. 9, the cover 140 is not formed on the region corresponding to the terminal portion of the integrated circuit element 60 of the flexible circuit board 30 for example. This is because the signal line 80a of the signal line portion 80 and the terminal portion of the integrated circuit element 60 are joined. As a joining scheme, metal eutectic bonding can be used for example.

With the above structure, the risk of breaking of the integrated circuit 60 on the flexible circuit board 30 when the display panel 20 is bent can be reduced. The stress placed on the display panel 20 and the integrated circuit element 60 is detailed below.

Figure 10:
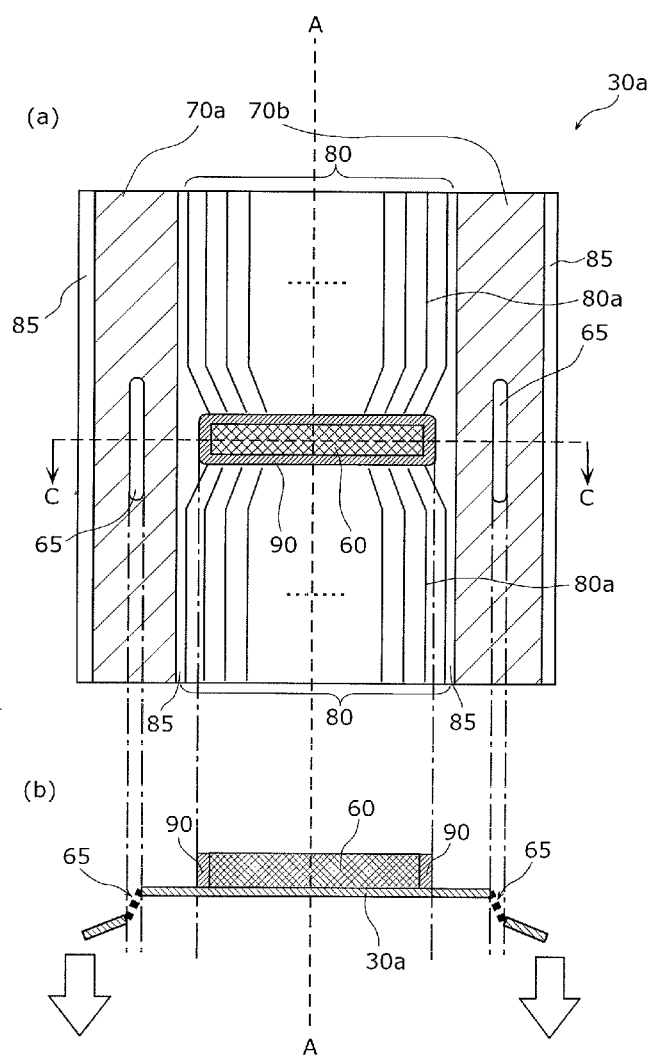
FIGS. 10 (*a*) and (*b*) illustrates stress placed on the flexible circuit board when the display panel is bent.

FIG. 10 illustrates stress placed on the flexible circuit board 30a when the display panel 20 of the flexible display 10 in FIG. 3 is bent along the A-A line. In FIG. 10, (a) is a top view of the flexible circuit board 30a, and (b) is a sectional view (sectional view along C-C line in (a) in FIG. 10) of (a) in FIG. 10.

When the display panel 20 is bent along the A-A line, the stress indicated by the arrow in (b) in FIG. 10 is placed on the flexible circuit board 30a, and the flexible circuit board 30a itself tries to bend.

However, with the flexible display 10 according to the present embodiment, the stress caused by the bending escapes from the opening portion 65 provided in the flexible circuit board 30a, the region in which the integrated circuit element 60 is provided of the flexible circuit board 30a does not bend, which allows no stress to reach the integrated circuit element 60. This reduces the risk of the integrated circuit 60 flaking off from the flexible circuit board 30a or braking.

As described above, with the present embodiment, the opening portion 65 provided in the flexible circuit board 30 makes it possible to realize a highly-reliable flexible display which reduces the risk of flaking or breaking of the integrated circuit element 60 caused by bending of the display panel 20.

It is to be noted that the shape and the position of the opening portion 65 are not limited to the above-described shape and position.

For example, the opening portion 65 may be in a shape of a slit.

Figure 11:
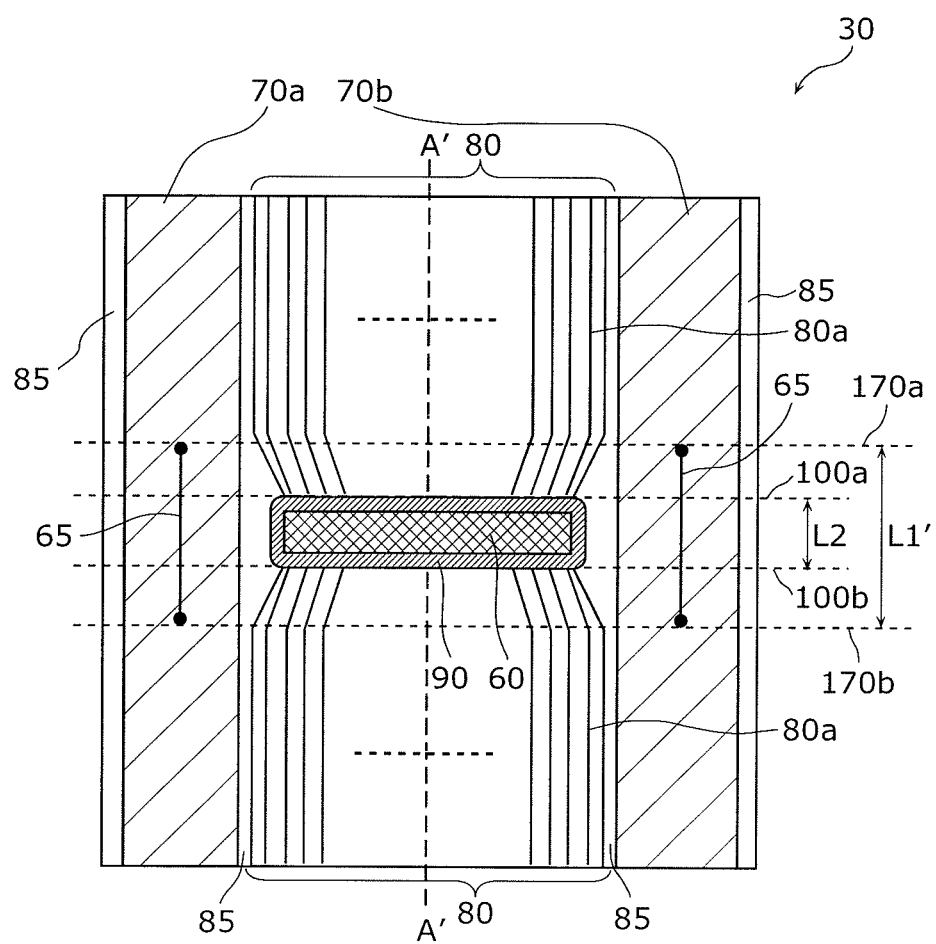
FIG. 11 is a top view of the flexible circuit board in the case where the opening portion is in a shape of a slit.

FIG. 11 is a top view of the flexible circuit board 30 in the case where the opening portion 65 is in a shape of a slit. Although the top face of the flexible circuit board 30 in FIG. 11 also has the cover 140 as in FIG. 5, the cover 140 is not shown in FIG. 11 to facilitate explanation.

As shown in FIG. 11, the opening portion 65 in a slit shape is provided for each of the power source lines 70a and 70b, and the integrated circuit element 60 and the slit opening portion 65 are disposed in the first direction which is parallel to the side of the display unit 20 to which the flexible circuit board 30 is connected. Furthermore, the integrated circuit element 60 is disposed between the two slit opening portions 65. It is to be noted that the two slit opening portions 65 have the same shape.

The slit opening portion 65 extends in the second direction as in FIG. 11. Furthermore, in the power source lines 70a and 70b, the current flows in the second direction. Specifically, the slit opening portion 65 has a lengthwise direction parallel to the direction of the current in the power source lines 70a and 70b.

This suppresses the increase in the line resistance, since the slit opening portion 65 extends in the same direction as the current. Furthermore, the slit opening portions 65 occupy smaller areas in the power source lines 70a and 70b than other shapes, which produce a greater advantageous effect in suppressing the line resistance.

When the display panel 20 is bent and the flexible circuit board 30 is bent along the A'-A' line in FIG. 11, the slit opening portions 65 provided in the flexible circuit board 30 allows no bending stress to be placed on the integrated circuit element 60. This reduces the risk of the integrated circuit 60 flaking off from the flexible circuit board 30 or braking.

The integrated circuit element 60 is disposed in a region between a straight line 170a which passes through a first end of the slit opening portion 65 in the second direction which is parallel to the first direction (terminal portion closer to the display panel 20) and a straight line 170b which passes through a second end of the slit opening portion 65 in the second direction (terminal portion closer to the driving board) and is parallel to the first direction.

The length of the integrated circuit element 60 in the second direction (length L2 in FIG. 11) is shorter than the length of the slit opening portion 65 in the second direction (length L1' in FIG. 11).

This reduces the stress to be placed on both the integrated circuit element 60 itself and the joined portion between the terminal portion of the integrated circuit element 60 and the signal line portion 80, when the flexible circuit board 30 is bent.

Furthermore, in FIG. 11, the slit opening portion 65 has circular openings at both ends in the second direction. This shape produces an advantageous effect of preventing the flexible circuit board 30 from being disconnected from the both ends of the slit opening portion 65 when the display panel 20 is bent repeatedly.

Furthermore, the opening portion 65 may be in an oval shape for example.

Figure 12:
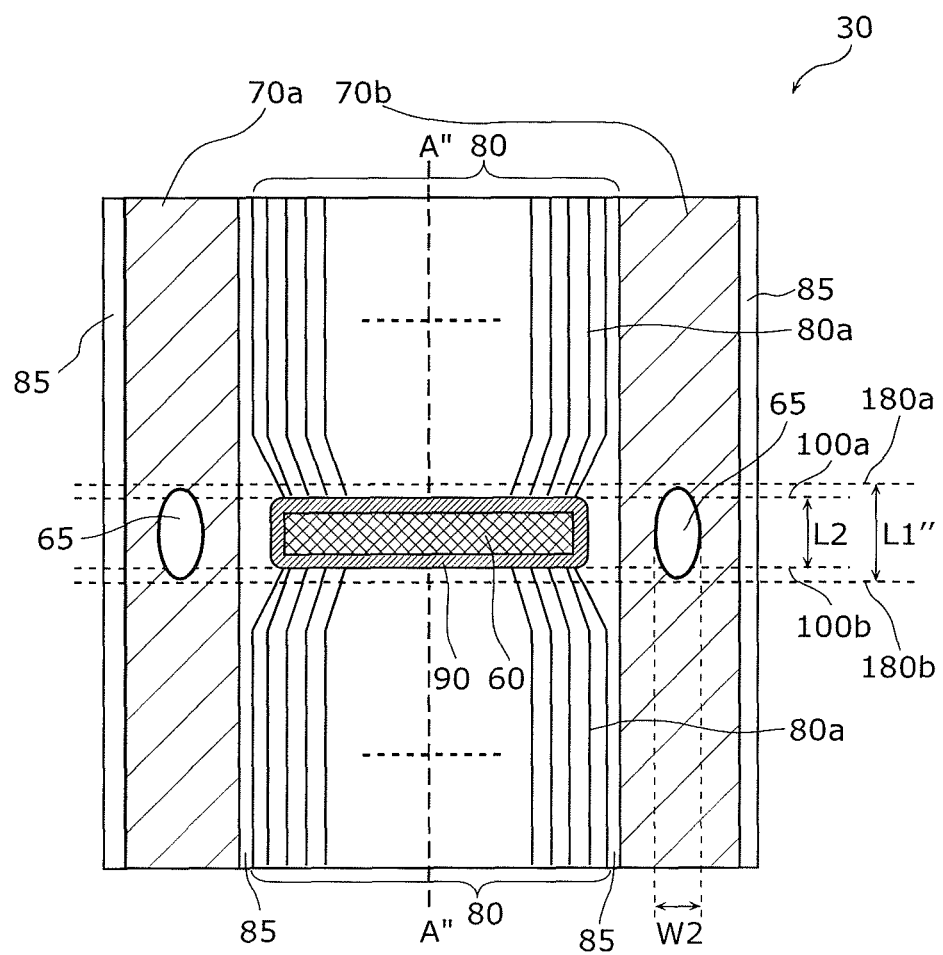
FIG. 12 is a top view of the flexible circuit board in the case where the opening portion is in a shape of a circle.

FIG. 12 is a top view of the flexible circuit board 30 in the case where the opening portion 65 is in a shape of an oval extending in the second direction. Although the top face of the flexible circuit board 30 in FIG. 12 also has the cover 140 as in FIG. 5, the cover 140 is not shown in FIG. 12 to facilitate explanation.

As shown in FIG. 12, the opening portion 65 in an oval shape is provided for each of the power source lines 70a and 70b, and the integrated circuit element 60 and the oval opening portion 65 are arranged along the side to which the flexible circuit board 30 of the display panel 20 is connected. Furthermore, the integrated circuit element 60 is disposed between the two circular opening portions 65. It is to be noted that the two oval opening portions 65 have the same shape.

When the display panel 20 is bent and the flexible circuit board 30 is bent along the A"-A" line, the oval opening portions 65 provided on the flexible circuit board 30 allows no bending stress to reach the integrated circuit element 60. This reduces the risk of the integrated circuit 60 flaking off from the flexible circuit board 30 or braking.

The integrated circuit element 60 is disposed in a region between a straight line 180a which passes through a first end of the oval opening portion 65 in the second direction which is parallel to the first direction (terminal portion closer to the display panel 20) and is parallel to the first direction and a straight line 180b which passes through a second end of the oval opening portion 65 in the second direction (terminal portion closer to the driving board) and is parallel to the first direction (tangent line of the opening portion 65).

The length of the integrated circuit element 60 in the second direction (length L2 in FIG. 12) is shorter than the length of the oval opening portion 65 in the second direction (length L1" in FIG. 12). The length of the circular opening portion 65 in the first direction (length W2 in FIG. 12) is shorter than the line width of the power source lines 70a and 70b.

This reduces the stress placed on both the integrated circuit element 60 itself and the joined portion between the terminal portion of the integrated circuit element 60 and the signal line portion 80, when the flexible circuit board 30 is bent.

Furthermore, the oval opening portion 65 has no corner within the opening portion 65, which produces an advantageous effect of preventing the flexible circuit board 30 from being disconnected when the display panel 20 is bent repeatedly.

As described above, the opening portions 65 in different shapes can each produce the advantageous effect of reducing the stress placed on the integrated circuit element 60 caused by bending of the display panel 20. Specifically, the shape of the opening portion 65 is not limited to the shapes described in the present embodiment.

The opening portions 65 do not have to be provided in the power source lines 70a and 70b.

Figure 13:
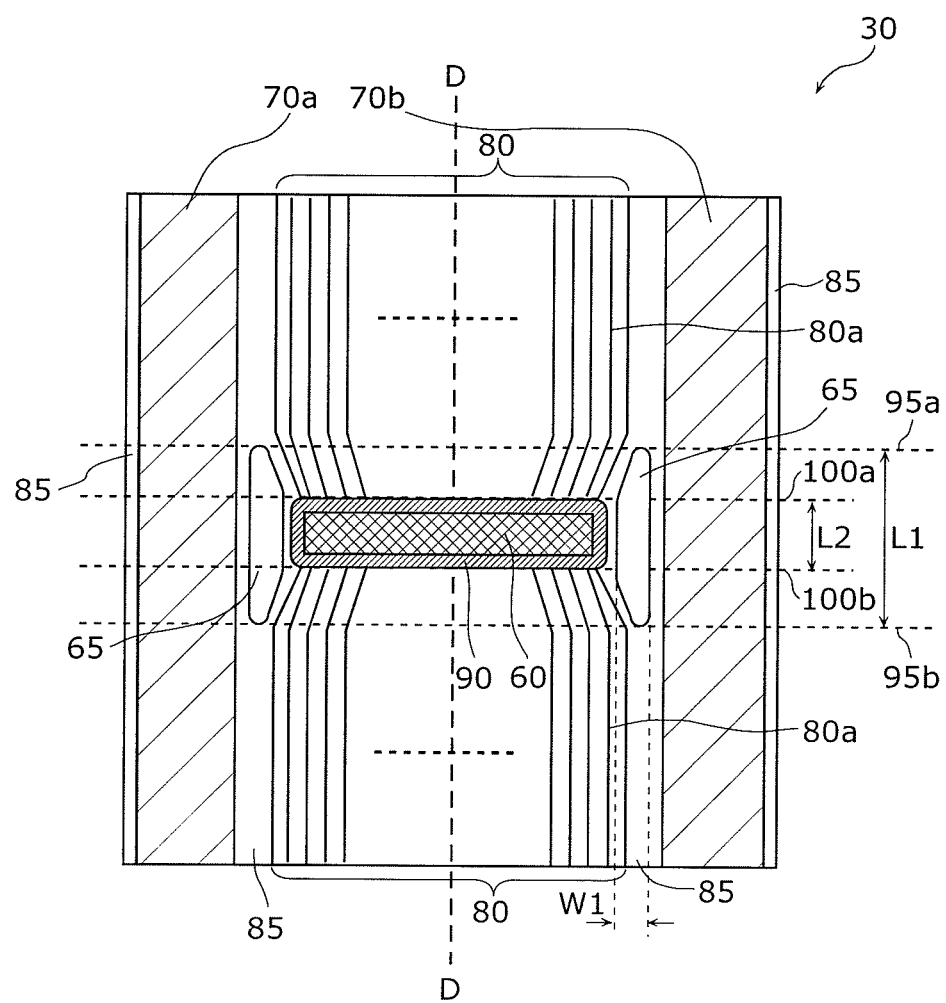
FIG. 13 is a top view of the flexible circuit board in the case where the opening portion is provided in a pattern portion.

FIG. 13 is a top view of the flexible circuit board 30 in the case where the opening portion 65 is provided not in the power source lines 70a and 70b but in the pattern portion 85. Although the top face of the flexible circuit board 30 in FIG. 13 also has the cover 140 as in FIG. 5, the cover 140 is not shown in FIG. 13 to facilitate explanation.

In FIG. 13, the opening portion 65 in a shape along the line pattern of the signal line portion 80 is provided not in the power source lines 70a and 70b but in the pattern portion 85. Two of the opening portion 65 in the above shape are provided in the pattern portion 85, and the opening portion 65 is extending in the second direction which is parallel to the side of the display panel 20 to which the flexible circuit board 30 is connected. The integrated circuit element 60 and the opening portion 65 are arranged in the first direction. Furthermore, the integrated circuit element 60 is disposed between the two opening portions 65. It is to be noted that the two opening portions 65 are symmetric.

When the display panel 20 is bent and the flexible circuit board 30 shown in FIG. 13 is bent along the D-D line, the opening portions 65 provided in the flexible circuit board 30 allows no bending stress to reach the integrated circuit element 60. This reduces the risk of the integrated circuit 60 flaking off from the flexible circuit board 30 or braking.

As described above, even when the opening portion 65 is provided in a location other than in the power source lines 70a and 70b, for example in the pattern portion 85, a highly-reliable flexible display can be realized which reduces the risk of flaking or breaking of the integrated circuit element 60 caused by bending of the display panel 20.

Although the flexible circuit board 30 has two of the opening portion 65 and the integrated circuit element 60 is provided between the two opening portions 65 in the present embodiment, the opening portion 65 may be one.

Figure 14:
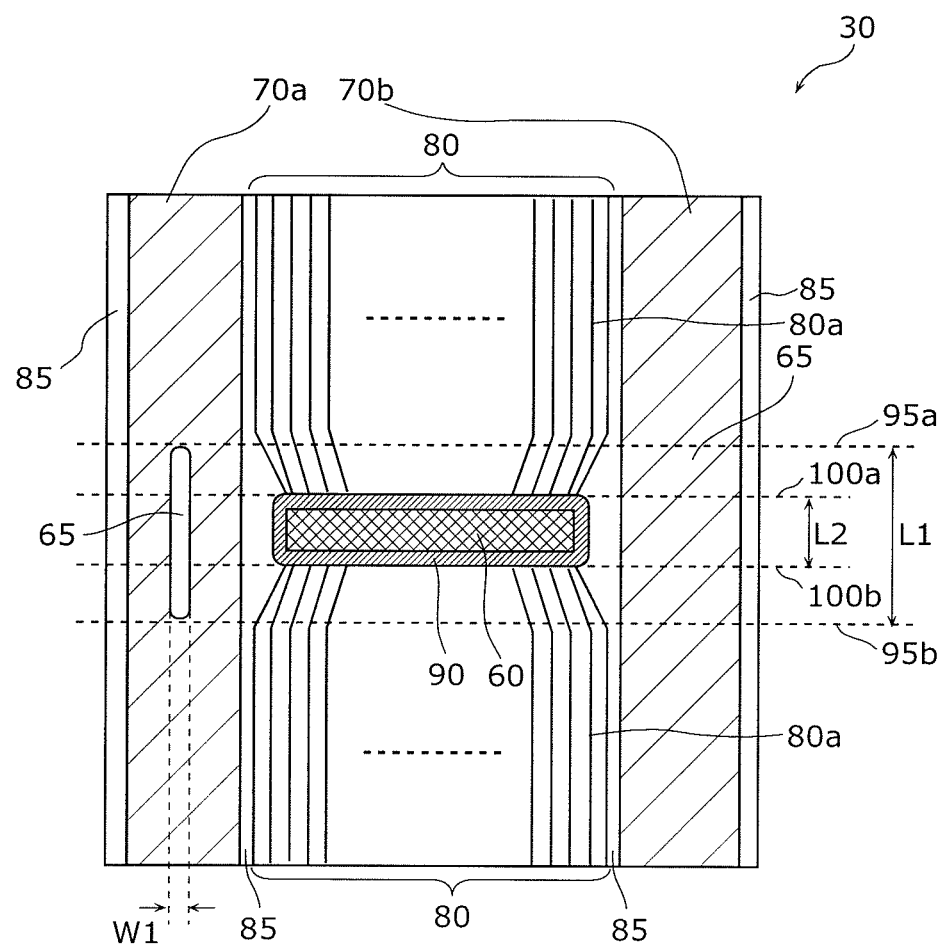
FIG. 14 is a top view of the flexible circuit board in the case where only one opening portion is provided.

FIG. 14 is a top view of the flexible circuit board 30 in the case where only one opening portion 65 is provided. Although the top face of the flexible circuit board 30 in FIG. 14 also has the cover 140 as in FIG. 5, the cover 140 is not shown in FIG. 14 to facilitate explanation.

The opening portion 65 is in a race track shape which is the same as the opening portions 65 shown in FIGS. 4, 7, and 13. The race-track opening portion 65 is disposed only in the power source line 70a, and not in the power source line 70b. As shown in FIG. 14, even in the case of only one opening portion 65, the integrated circuit element 60 and the race-track opening portion 65 are arranged in the first direction which is parallel to the side of the display panel 20 to which the flexible circuit board 30 is connected, which reduces the stress placed on the region in which the integrated circuit element 60 is provided, when the flexible circuit board 30 is bent.

Furthermore, the opening portion 65 may include a plurality of openings.

Figure 15:
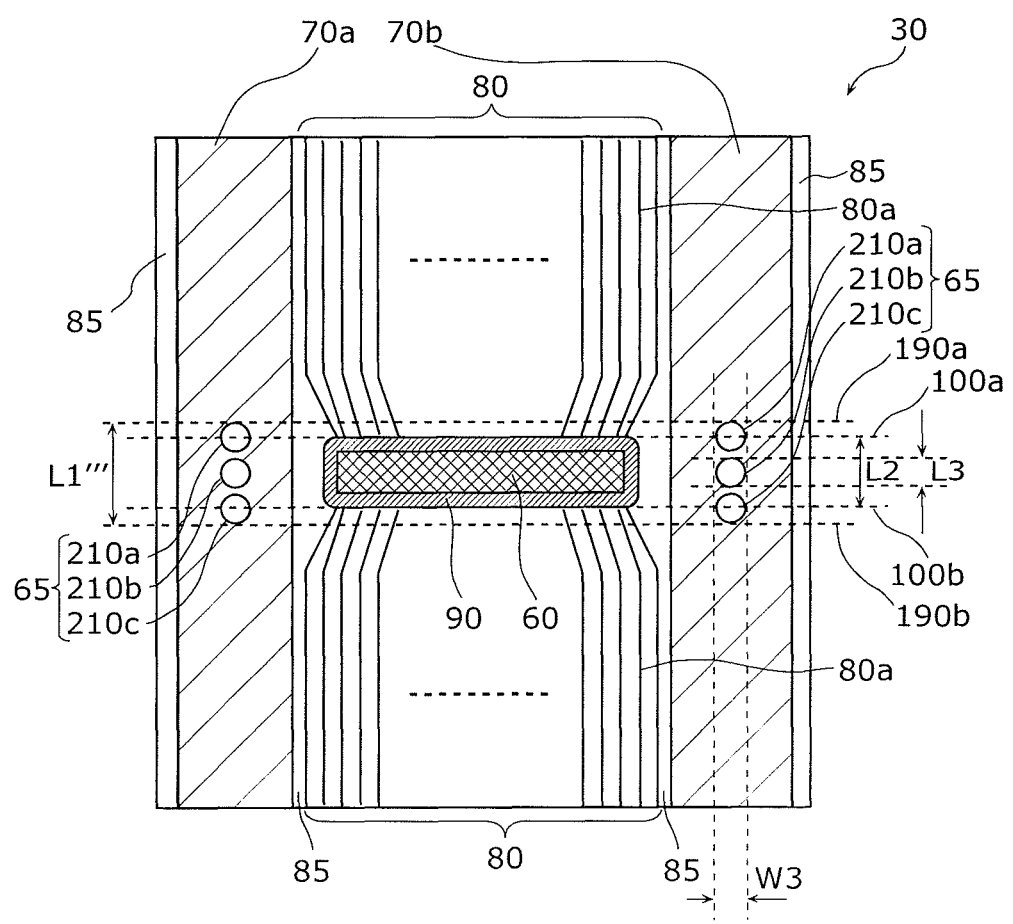
FIG. 15 is a top view of the flexible circuit board in the case where an opening portion includes three openings.

FIG. 15 is a top view of the flexible circuit board 30 in the case where each opening portion 65 has three openings. Although the top face of the flexible circuit board 30 in FIG. 15 also has the cover 140 as in FIG. 5, the cover 140 is not shown in FIG. 15 to facilitate explanation.

In FIG. 15, each of the openings 210a, 210b, and 210c which constitute the opening portion 65 has a circular shape.

The openings 210a, 210b, and 210c are arranged in the power source line 70a and along the second direction. Likewise, the openings 210a, 210b, and 210c are arranged in the power source line 70b and along the second direction. The openings 210a, 210b and 210c constitute the opening portion 65. As described above, the shape extending in the second direction vertical to the first direction which is parallel to the side of the display panel, of the opening portion according to the present invention includes a shape in which a plurality of circular openings are arranged on a single straight line, which can be regarded as a shape extending roughly in the second direction when viewed as a whole, for example.

The integrated circuit element 60 and each of the openings 210a, 210b, and 210c are arranged in the first direction which is parallel to the side of the display panel 20 to which the flexible circuit board 30 is connected.

The integrated circuit element 60 is disposed in a region between a straight line 190a which passes through a first end of the opening portion 65, that is an end of the opening 210a, in the second direction which is parallel to the first direction (terminal portion closer to the display panel 20) and is parallel to the first direction and a straight line 190b which passes through a second end of the opening portion 65, that is an end of the opening 210a, in the second direction (terminal portion closer to the driving board) and is parallel to the first direction.

The length of the integrated circuit element 60 in the second direction (length L2 in FIG. 15) is shorter than the length of the opening portion 65 in the second direction (length L1''' in FIG. 15). The length of the opening portion 65 in the first direction (length W3 in FIG. 15), that is the diameter of the openings 210a, 210b, and 210c, is shorter than the line width of the power source lines 70a and 70b.

L3 is the length of the circular opening 210b in the second direction. In other words, L3 is the diameter of the opening 210b.

For example, in the case where the opening portion 65 includes only the opening 210b, the length of the opening 210b in the second direction (L3 in FIG. 15), that is the diameter, is shorter than the length of the integrated circuit element 60 in the second direction. Accordingly, the region between the straight line 190a and the straight line 190b in the flexible circuit board 30 does not include all the region in which the integrated circuit element 60 is provided of the flexible circuit board 30.

However, in the case where the opening portion 65 includes a plurality of openings namely the openings 210a, 210b, and 210c as in FIG. 14, the length L1'''> the length L2. Thus, the region between the straight line 190a and the straight line 190b in the flexible circuit board 30 includes all the region in which the integrated circuit element 60 is provided of the flexible circuit board 30.

In other words, forming the opening portion 65 with a plurality of openings reduces the stress placed on the integrated circuit element 60 caused by bending of the display panel 20 more effectively as compared with the case where the opening portion 65 includes only the opening 210b.

The above has described the embodiment of the present invention. With the flexible display according to the present embodiment, the stress placed on the integrated circuit element caused by bending of the display panel is reduced by the opening portion provided on the flexible circuit board. With this, a highly-reliable flexible display can be realized which reduces the risk of flaking of the integrated circuit element from the flexible circuit board and breaking of the integrated circuit element and the flexible circuit board.

It is to be noted that the present invention is not limited to the embodiment. Other forms in which various modifications apparent to those skilled in the art are applied to the embodiment, or forms structured by combining constituent elements of different embodiments are included within the scope of the present invention, unless such changes and modifications depart from the scope of the present invention.

INDUSTRIAL APPLICABILITY

The flexible display according to the present invention can be used as a display including a flexible display panel, and especially as a bendable flexible display for a TV and a personal computer, for example.

REFERENCE SIGNS LIST 10, 410 Flexible display
20, 420 Display panel
30, 30a, 430 Flexible circuit board
45 Pixel region
50 Line region
55 Coated portion
60, 460 Integrated circuit element
65, 465 Opening portion
70a, 70b Power source line
80 Signal line portion
80a Signal line
85 Pattern portion
90 Reinforcing resin
95a, 95b, 100a, 100b, 170a, 170b, 180a, 180b, 190a, 190b Straight line
120 Base
140 Cover
150 Metal layer
210a, 210b, 210c Opening

The invention claimed is:

1. A flexible display comprising:
a display panel which is flexible; and
a flexible circuit board which is disposed on a side of the display panel and includes an integrated circuit element provided on a surface thereof, a power source line which supplies a driving current to the display panel, and an opening portion provided on the power source line,
wherein the opening portion is in a shape extending in a second direction vertical to a first direction which is parallel to the side of the display panel, and the integrated circuit element and the opening portion are arranged in the first direction.

2. The flexible display according to claim 1,
wherein the integrated circuit element is disposed in a region between a straight line which passes through a first end of the opening portion in the second direction and is parallel to the first direction and a straight line which passes through a second end of the opening portion in the second direction and is parallel to the first direction.

3. The flexible display according to claim 1,
wherein the flexible circuit board includes a plurality of the opening portions, and
the integrated circuit element is disposed between the opening portions.

4. The flexible display according to claim 1,
wherein a lengthwise direction of the opening portion is parallel to a direction of a current in the power source line.

5. The flexible display according to claim 1,
wherein the opening portion is in a shape of a slit.

6. The flexible display according to claim 1,
wherein the opening portion has an inner peripheral surface covered with resin.

* * * * *